United States Patent [19]

Myers

[11] Patent Number: 5,798,724
[45] Date of Patent: Aug. 25, 1998

[54] INTERPOLATING DIGITAL TO ANALOG CONVERTER ARCHITECTURE FOR IMPROVED SPURIOUS SIGNAL SUPPRESSION

[75] Inventor: Brent Myers, Palm Bay, Fla.

[73] Assignee: Harris Corporation, Melbourne, Fla.

[21] Appl. No.: 601,401

[22] Filed: Feb. 14, 1996

[51] Int. Cl.$^6$ ................................................. H03M 1/66
[52] U.S. Cl. ........................... 341/146; 341/159; 341/172
[58] Field of Search ................................ 341/159, 172, 341/118, 146, 190

[56] References Cited

U.S. PATENT DOCUMENTS

| | | | |
|---|---|---|---|
| 4,331,894 | 5/1982 | Gregorian et al. | |
| 4,857,778 | 8/1989 | Hague | 302/521 |
| 4,977,403 | 12/1990 | Larson | 341/143 |
| 5,012,245 | 4/1991 | Scott et al. | 341/150 |
| 5,245,344 | 9/1993 | Sooch | 341/150 |
| 5,327,092 | 7/1994 | Inogai et al. | |

OTHER PUBLICATIONS

High Resolution Suiched Capacitor D/A Converter, Microelectronics Journal vol. 12 No. 2 1981, pp. 10–13.

*Primary Examiner*—Jeffrey A. Gaffin
*Assistant Examiner*—Jason H. Vick
*Attorney, Agent, or Firm*—Rogers & Killeen

[57] ABSTRACT

A digital-to-analog conversion method and interpolating digital-to-analog converter for a data modulation system which reduces the spurious energy content of the output signal by an order of magnitude to thereby permit use of a less complex reconstruction filter to smooth the analog output. The process is a two step charge redistribution with feedback to interpolate between samples. DC offset is minimized by using double sampling techniques which permit a fully held signal between interpolation samples. A first conversion stage converts the first n bits of an N bit data signal received at an input rate to a first output value, and a second conversion stage converts the remainder of the N bits and combines signals from the two conversion stages to provide a combined output to an interpolation stage which provides an interpolated output at an interpolation output rate. A feedback circuit provides the interpolated output to an input of the second conversion stage.

12 Claims, 3 Drawing Sheets

INTERPOLATING DIGITAL TO ANALOG CONVERTER ARCHITECTURE FOR IMPROVED SPURIOUS SIGNAL SUPPRESSION

BACKGROUND OF THE INVENTION

The present invention relates to digital to analog converters, and more particularly to a digital to analog conversion method and an interpolating digital to analog converter with improved spurious energy rejection.

Systems for modulating digital data desirably suppress spurious energy in order to facilitate modulation to a higher frequency within a finite transmission bandwidth. Typically an input data stream is conditioned (or shaped) with a pre-modulation baseband processor 10 in FIG. 1. Conventional digital interpolation techniques (e.g., finite impulse response (FIR) filter 12) generate a sequence of digital words at an interpolation rate which represent the amplitude versus time relationship of the pulse shape. A digital to analog converter (DAC) 14 running at the interpolation rate approximates the pulse shape in discrete time form. Conditioning of the pulse shape is completed in a continuous time reconstruction filter 16 where the discrete time nature of the pulse is smoothed to suppress spurious energy which occurs at the update rate of the DAC 14.

As will be appreciated by those of skill in the art, the reconstruction filter 16 should be of a high order (typically an order greater than four) for high performance systems. It is also desirable that such filters can be manufactured in a monolithic integrated circuit. However, high order reconstruction filters are very difficult to manufacture in a monolithic integrated circuit (if it can be done at all), and an alternative approach is desired. The approach proposed herein is to reduce the need for a high order reconstruction filter by improving the spurious energy rejection in the DAC which precedes it. For example, if the spurious energy occurring at the DAC output rate is reduced by one order of magnitude compared to the prior art converter, the order of the reconstruction filter may be reduced from at least four to one.

An approach for dealing with a related problem is discussed in U.S. Pat. No. 5,327,092 issued Jul. 5, 1994 to Inogai, et al. which suggests providing two switched-capacitor filter stages, thereby reducing the order of a post-filter so that it may be more easily manufactured in a monolithic integrated circuit. However, the circuit therein is still cumbersome, does not take into account a dc offset which may build up during operation, and may be further improved.

In an embodiment of the present invention the DAC is based on charge redistribution. DACs of this general type are known, and may use a cascaded design to reduce the need for precisely matched capacitors and resistors (see, for example, "High-resolution switched-capacitor D/A converter" by R. Gregorian, *Microelectronic Journal*, Vol. 12, No. 2, 1981). However, the cascaded design does not afford the desired reduction of spurious energy and further improvements are needed.

An embodiment of the present invention includes a switched-capacitor interpolation filter as an integral component of the DAC. The filter output is fed back to a conversion stage of the DAC to smooth the analog output and thereby reduce the spurious energy in the output. While switched-capacitor interpolation filters are generally known, there has been no suggestion to integrate them into a DAC as proposed herein. (See, for example, U.S. Pat. No. 4,331,894 to Gregorian, et al.)

Accordingly, it is an object of the present invention to provide a novel digital to analog conversion method and interpolating converter with improved produceability and spurious energy rejection, and with minimal dc offset, thereby obviating the problems of the prior art.

It is another object of the present invention to provide a novel digital to analog conversion method and interpolating converter with multiple stages in which a conversion stage and the interpolation stage are combined and an interpolated amplitude output is fed back from the interpolation stage to the conversion stage.

It is yet another object of the present invention to provide a novel digital to analog conversion method and interpolating converter with two conversion stages, the last of which is combined with an interpolation stage, for converting an N bit data signal arriving at an input rate to an amplitude value output which is thereafter interpolated to provide an interpolated amplitude output at an interpolation output rate.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

The present invention recognizes that digital-to-analog conversion is a discrete time process, and increases the output rate over the input rate by interpolating the amplitude values. The interpolation herein allows the invention to reduce the spurious energy content of the output signal by an order of magnitude to thereby permit use of a less complex reconstruction filter. The process may be described as a two step charge redistribution with feedback to interpolate between samples. DC offset is minimized by using double sampling techniques which permit a fully held signal between interpolation samples.

Figure 1:
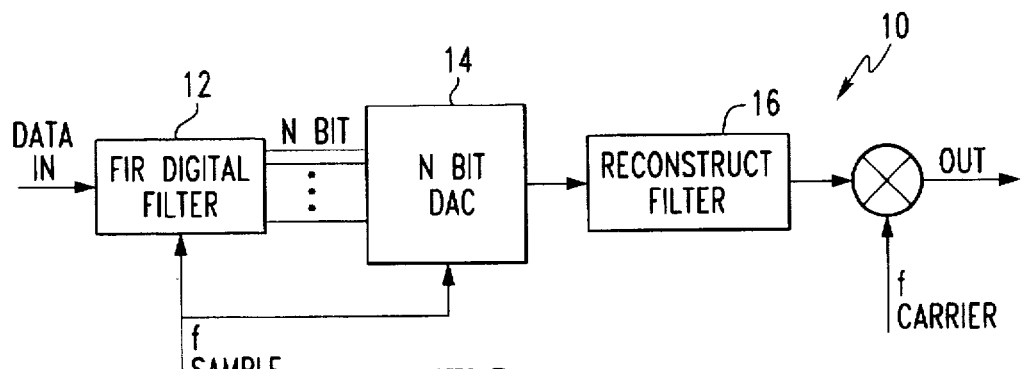
FIG. 1 is block diagram of a pre-modulation baseband processor of the prior art in which the present invention finds application.
Figure 2:
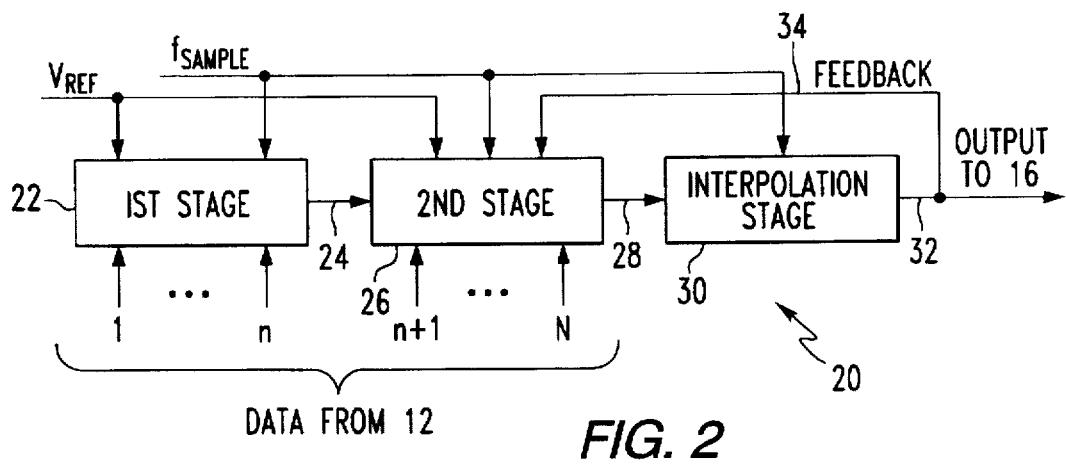
FIG. 2 is a block diagram of an embodiment of the present invention.

With reference now to FIG. 2, an embodiment of the interpolating digital-to-analog converter 20 of the present invention may include a first conversion stage 22 for converting the first n bits (e.g., the n least significant bits) of an N bit data signal received at an input rate to a first output value in line 24, a second conversion stage 26 for combining the remainder of the N bits (e.g., the most significant bits) in the data signal with the first output value to provide an amplitude value output in line 28, an interpolation stage 30 integral with second conversion stage 26 for providing an interpolated amplitude output at node 32 at an interpolation output rate which is a multiple of the input rate, and a feedback circuit 34 for feeding back the interpolated amplitude output from interpolation stage 30 to second conversion stage 26.

Figure 4:
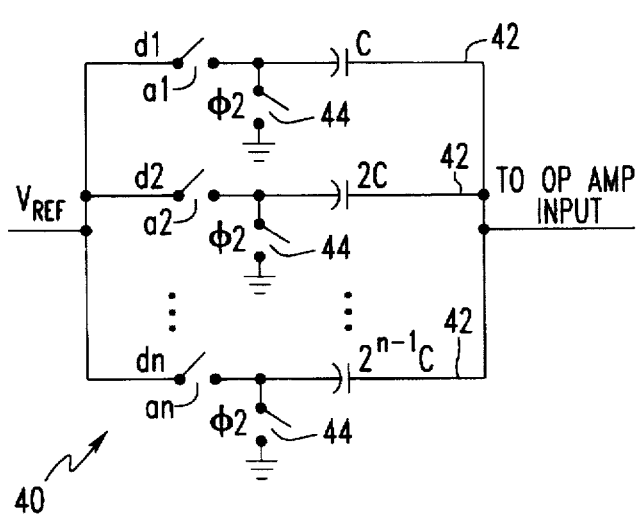
FIG. 4 is a circuit diagram of an embodiment of the capacitor array of FIG. 3.
Figure 5:
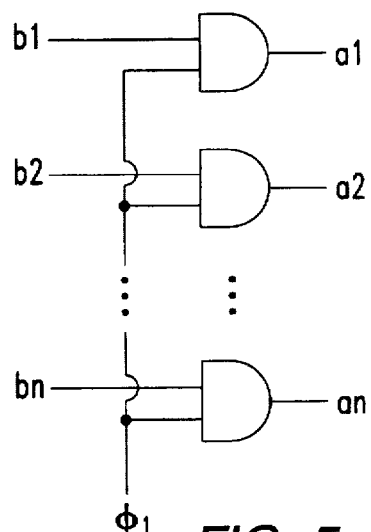
FIG. 5 is a partial circuit diagram illustrating activation of switches d1, d2, . . . , dn in the capacitor array of FIG. 4.
Figure 3:
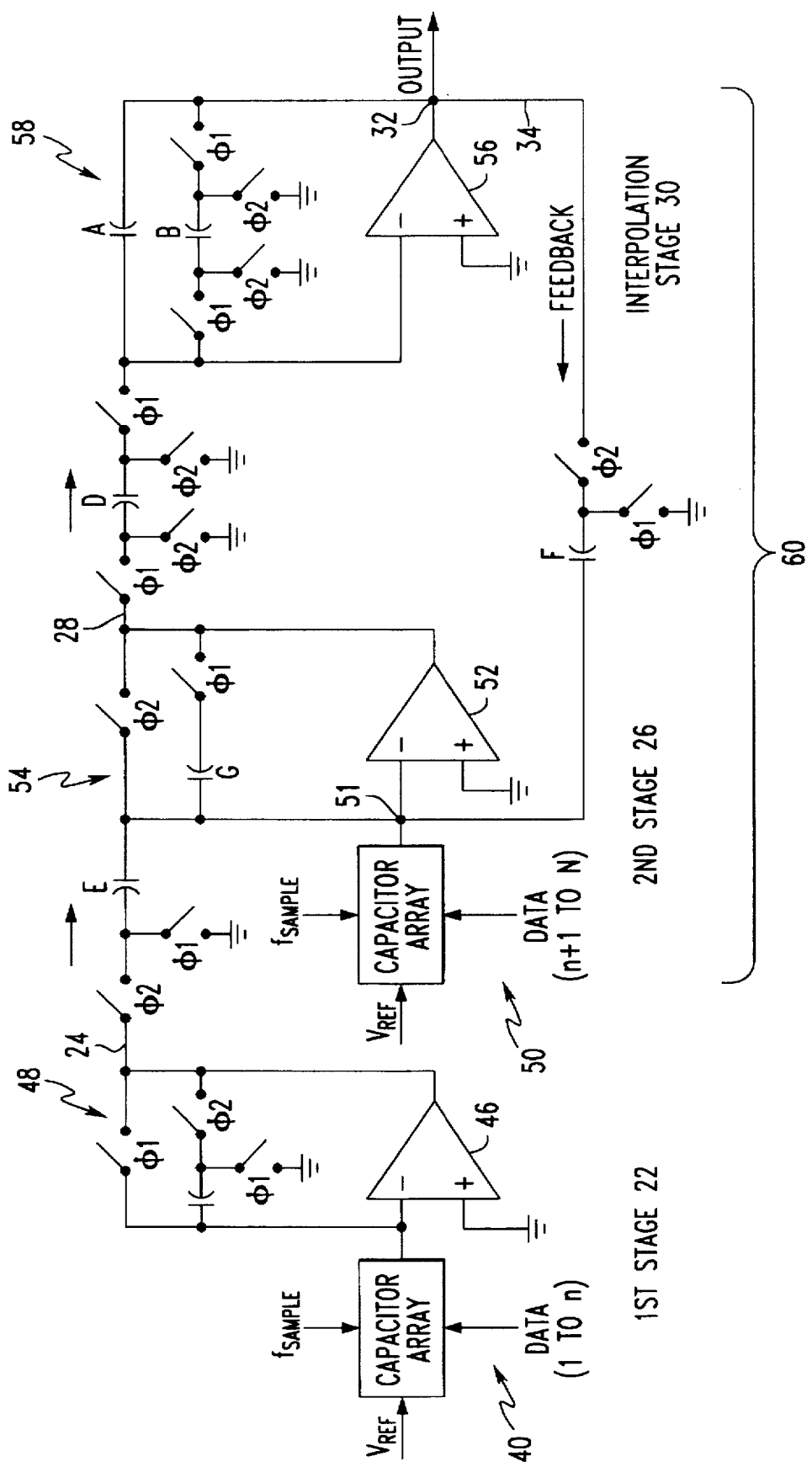
FIG. 3 is a partial circuit and partial block diagram of a embodiment of the present invention.

A preferred embodiment is illustrated in FIGS. 3–5. First conversion stage 22 may include an offset compensated amplifier connected to a stable reference, as is conventional. First stage 22 may include a first capacitor array 40 (for which see FIG. 4) with n parallel paths 42 with capacitors C therein which are switched into and out of operation by switches d1, d2, ... dn which are respectively responsive to the first n data bits b1, b2, ..... bn gated with clock $\phi$1. FIG. 5 illustrates the use of AND gates to provide signals a1, a2, ..., an for operation of switches d1, d2, ... dn. In FIG. 4, the prefix to C indicates a multiple of the unit capacitance C in a preferred embodiment, although other values may be used. Switches 44 discharge capacitors C during one of the time periods $\phi$1 and $\phi$2 which alternate at the sampling frequency (the time period shown next to a switch indicates a preferred time period, although the indicated time periods may be swapped in another embodiment.) The sampling frequency is greater than the digital data update frequency, and the interpolation factor is the ratio of the sampling frequency to the data update frequency. For example, an update frequency of 1.024 MHz and a sampling frequency of 5.12 MHz yields an interpolation factor of 5.

The output of capacitor array 40 may be provided as an input to a non-inverting terminal (−) of a first operational amplifier 46. A switched-capacitor circuit 48 may be provided for amplifier 46. The output of amplifier 46 may be provided as the first output value in line 24.

Second conversion stage 26 may include a second capacitor array 50 with (N−n) parallel paths, each with a capacitor therein, which are switched responsive to the remainder of the N data bits. Second capacitor array 50 may be identical to first array 40 shown in FIG. 4, except for the data bits to which the switches d1, ... dn respond (i.e., bn+1, bn+2, ... . bN gated by clock $\phi$2) and the time period in which switches 44 are closed (during $\phi$1 instead of $\phi$2.)

The output of capacitor array 50 may be connected to node 51 which is a summing node for the first stage least significant bit conversion network (i.e., for bits 1 to n) through capacitor E in line 24, and capacitor array 50, which is the conversion network for the most significant bits (i.e., n+1 to N). A switched-capacitor circuit 54 may be provided to hold the charge transferred from the summing operation. The resulting output of amplifier 52 may be provided in output line 28 prior to interpolation stage 30.

Interpolation stage 30 may include a third operational amplifier 56 with a switched-capacitor circuit 58. Second stage 26 and interpolation stage 30 are desirably integrated into a single component in a monolithic integrated circuit DAC. The combination of the two stages reduces the number of components and reduces the necessary silicon area.

Integral stages 26 and 30 may also include a feedback circuit 34 with a feedback capacitor F which introduces a complex pole so that DAC stage 26 and interpolation stage 30 together act as a second order filter 60. Hence, design of the desired interpolation response is reduced to the design of a simple second order filter. The resulting interpolated output is available at node 32.

Connections between the stages may include switched-capacitors to ensure continuity therebetween, such as switched-capacitor E in line 24 between first stage 22 and second stage 26, and switched-capacitor D in line 28 between second stage 26 and interpolation stage 30.

As will be appreciated, the embodiment of FIG. 3 builds on the circuitry described in the above-reference article by Gregorian. However, the second stage of the Gregorian DAC is replaced by filter network 60 (stages 26 and 30 and feedback circuit 34) which improves rejection of spurious signals. In the prior art, the first conversion stage is typically followed by an identical second conversion stage which generates the most significant bits portion of the analog signal. For a conventional 8 bit DAC, the first stage would sum into a second stage with an attenuation of 16 to realize the least significant bits portion of the signal.

The embodiment of FIG. 3 replaces the conventional second stage with a filter designed to eliminate offset effects while realizing a second order transfer function. This filter network, 60, is incorporated directly into the DAC and is clocked at a higher speed (five times the rate at which the digital word is being updated in one embodiment) thus smoothing the DAC output.

Further, the offset correction of the second conversion stage 26 effectively removes dc offset at the output from operational amplifier 56. The filter circuitry herein generates an output offset voltage $V_{OFFOUT\,56}$ at operational amplifier 56 which is dependent on the input offset voltage $V_{OFFSET\,52}$ of operational amplifier 52:

$$V_{OFFOUT\,56} = -(F/G + E/G)\,V_{OFFSET\,52}$$

The voltage offset of operational amplifier 52 may be set to zero by the correlated double sampling technique illustrated in FIG. 3. The offset of operational amplifier 52 is sampled during one phase (e.g., $\phi$2) and removed during the other phase ($\phi$1). The resulting output has a second order transfer function with the offset removed.

Figure 6:
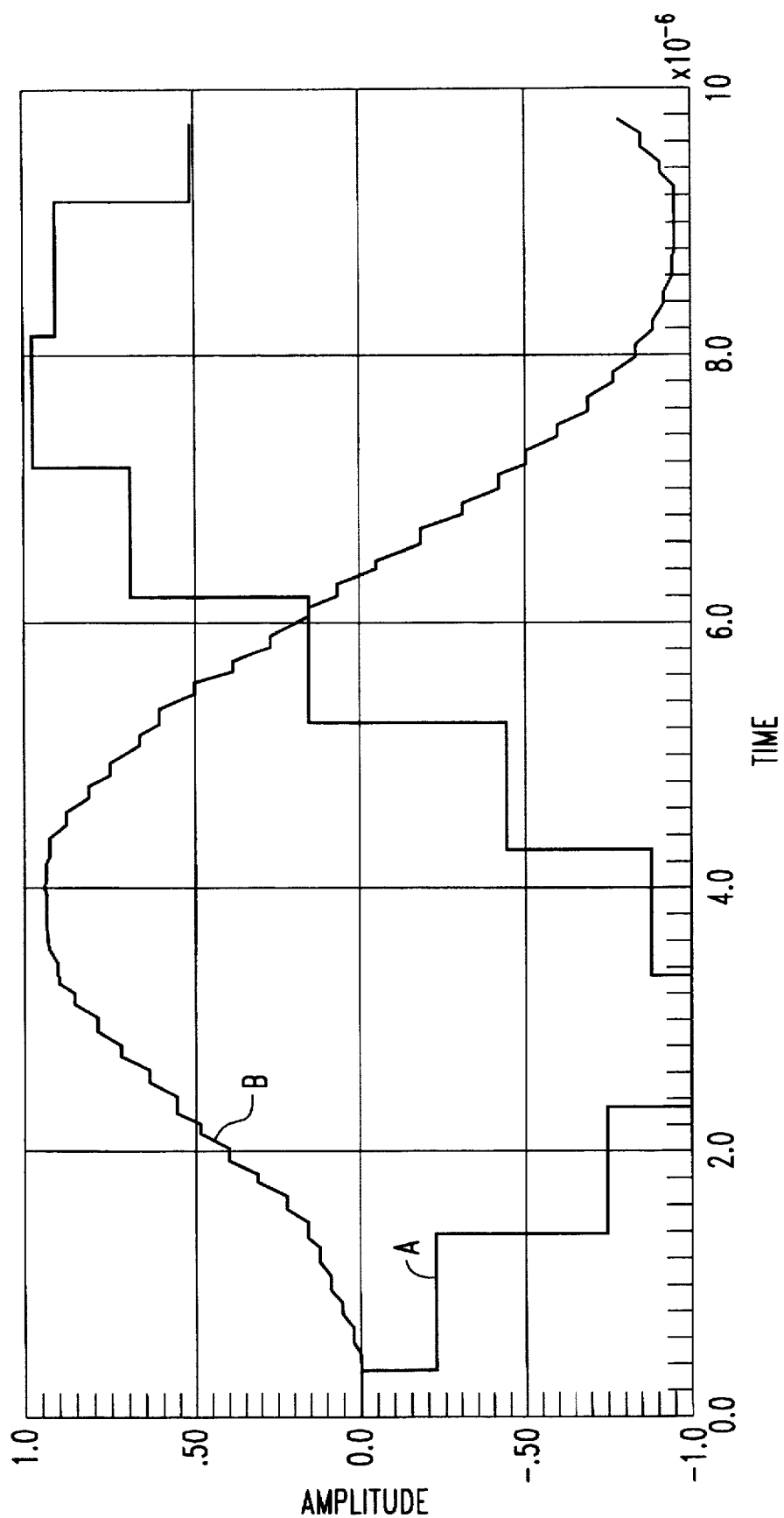
FIG. 6 is a graph illustrating examples of DAC output with (curve B) and without (curve A) the integrated interpolating filter of the present invention.

An example of the five times interpolation is illustrated in FIG. 6 in which curve A is an output from a DAC without the integrated interpolating filter of the present invention and curve B is an output from a DAC incorporating an embodiment of the present invention. In this example, the DAC update rate was 1.024 MHz and the interpolation rate was 5.12 MHz. The interpolating DAC of this example provides no more than 0.2 dB loss at 100 KHz while giving 20 dB extra attenuation at the spurs of 1.024 MHz. This gives nearly 37 dB of spurious rejection, 20 dB over that achievable in the prior art.

The present invention may provide any reasonable interpolation factor by varying capacitor values in consideration of the clock frequencies. Selection of appropriate capacitances of capacitors A, B, D and F set the second order filter transfer function and hence the interpolation factor so as to reduce the spurious energy in the output by an order of magnitude compared to the spurious energy in outputs from simple prior art converters, thereby permitting a single order reconstruction filter following the DAC.

As is apparent, a somewhat similar result may be achieved by adding a filter to the cascaded DAC of the Gregorian article. In contrast, the present invention integrates the filter into the DAC and adds capacitors A, B, D, and F and operational amplifier 56. The mere addition of a filter to the Gregorian circuit would require these additions and substantially more. Thus, the present invention improves produceability and spurious energy rejection while using less silicon area than would be required without the present invention.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A multistage charge redistribution digital to analog converter (DAC) comprising a filter network which has a network data conversion stage integral with an interpolation stage for improving suppression of spurious signals in an input signal to the DAC, said interpolation stage being clocked at a rate which is a multiple of the input rate of the DAC input signal, and for feeding back an output therefrom to said network data conversion stage to smooth an analog signal output from the DAC.

2. The DAC of claim 1 further comprising a prior data conversion stage for receiving the input signal to the DAC and for converting n bits of an N bit input signal to the DAC to a first output value which is provided to said network data conversion stage.

3. The DAC of claim 2 wherein said network data conversion stage is for converting the remaining bits of the N bit input signal to a second output value and for combining the first and second output values to provide a combined output value.

4. The DAC of claim 3 wherein said interpolation stage comprises a switched-capacitor filter for receiving the combined output value and providing an interpolated output at an interpolation rate which is said multiple times the input rate.

5. The DAC of claim 1 wherein said interpolation stage comprises a first operational amplifier and first and second switched-capacitors in parallel paths connecting an input and output of said first operational amplifier.

6. The DAC of claim 5 wherein said interpolation stage is connected to said network data conversion stage through a third switched-capacitor.

7. A digital to analog converter (DAC) for converting an N bit data signal received at an input rate to an analog signal in which spurious energy in the received data signal is reduced in the analog signal, the converter comprising:

a first conversion stage for converting n bits of an N bit data signal received at an input rate to a first output value;

a filter network comprising,
 a second conversion stage for converting the remainder of the N bits in the data signal to a second output value, and for combining the first and second output values into a combined output value,
 an interpolation stage for receiving the combined output value from said second conversion stage and for providing an interpolated output at an interpolation output rate which is a multiple of the input rate, and
 a feedback circuit for feeding back the interpolated output from said interpolation stage to said second conversion stage, whereby the interpolated output is the analog signal with reduced spurious energy.

8. The DAC of claim 7 wherein said feedback circuit comprises a capacitor which, in conjunction with said second conversion stage, forms a complex pole for providing an interpolated output.

9. The DAC of claim 7 wherein said interpolation stage comprises a first operational amplifier and first and second switched-capacitors in parallel paths connecting an input and output of said first operational amplifier.

10. The DAC of claim 9 wherein said interpolation stage is connected to said second conversion stage through a third switched-capacitor.

11. A method of reducing spurious energy in an analog signal which is output from a digital to analog converter (DAC) which converts an N bit data signal received at an input rate to an analog signal, the method comprising the steps of:

(a) converting in a first conversion stage n bits of an N bit data signal received at an input rate to a first output value;

(b) combining in a second conversion stage the remainder of the N bits in the data signal with the first output value to provide an amplitude value output;

(c) providing an interpolated amplitude output from an interpolation stage which interpolates the amplitude value output at an interpolation output rate which is a multiple of the input rate; and (d) feeding back the interpolated amplitude output to an input to the second conversion stage, whereby spurious energy in the interpolated amplitude output is reduced from that obtained by a direct conversion of the data signal.

12. The method of claim 11 wherein the feedback step comprises the step of forming a complex pole.

* * * * *